(12) United States Patent
Blair

(10) Patent No.: US 6,591,371 B1
(45) Date of Patent: Jul. 8, 2003

(54) SYSTEM FOR COUNTING A NUMBER OF CLOCK CYCLES SUCH THAT A COUNT SIGNAL IS DIVERTED FROM A CASCADED SERIES OF WRITE LATCHES TO A CASCADED SERIES OF ERASE LATCHES

(75) Inventor: Gerard M Blair, Fort Collins, CO (US)

(73) Assignee: Hewlett Packard Development Company, L.P., Houston, TX (US)

( * ) Notice: Subject to any disclaimer, the term of this patent is extended or adjusted under 35 U.S.C. 154(b) by 0 days.

(21) Appl. No.: 09/483,863

(22) Filed: Jan. 18, 2000

(51) Int. Cl.$^7$ .............................. G06F 1/04; G06F 1/08
(52) U.S. Cl. ...................... 713/502; 713/400; 713/401; 713/501; 713/603
(58) Field of Search ................................ 713/501, 502, 713/503, 400, 401

(56) References Cited

U.S. PATENT DOCUMENTS

| | | | | |
|---|---|---|---|---|
| 5,084,837 A | * | 1/1992 | Matsumoto et al. ........... | 710/38 |
| 5,341,335 A | * | 8/1994 | Young et al. ........... | 365/189.02 |
| 5,373,542 A | * | 12/1994 | Sunouchi ...................... | 377/44 |
| 5,410,670 A | * | 4/1995 | Hansen et al. ........... | 365/189.01 |
| 6,169,501 B1 | * | 1/2001 | Ryan ........................... | 341/100 |

* cited by examiner

Primary Examiner—Thomas Lee
Assistant Examiner—Michael Nieves

(57) ABSTRACT

A system and method are provided for counting a number of clock cycles. In one embodiment, the system comprises a cascaded series of write latches and a cascaded series of erase latches. The output of each of the write latches is electrically coupled to a respective diverting multiplexer configured to divert a counting signal from the cascaded series of write latches to the cascaded series of erase latches. In order to count a specific number of cycles of the clock, one of the diverting multiplexers is set so as to divert a logical "1" advancing along the write latches into the erase latches. A specific number of clock cycles is counted by forcing a logical "1" to advance through a predetermined number of write and erase latches. Generally, the number of write and erase latches used to count a given number of clock cycles is even. Consequently, the present invention also includes an odd latch to enable the counting of an odd number of clock cycles. Also, a number of reset signal pathways are employed to reset the write latches as the logical "1" is advanced along the erase latches.

23 Claims, 3 Drawing Sheets

| Clock Cycle | States of Write, Erase, and Odd Latches |
|---|---|
| 0 | 0 0 0 0 0<br>0 0 0 0 0 |
| 1 | 1 0 0 0 0<br>0 0 0 0 0 |
| 2 | 1 1 0 0 0<br>0 0 0 0 0 |
| 3 | 1 1 1 0 0<br>0 0 0 0 0 |
| 4 | 1 1 1 1 0<br>0 0 0 0 0 |
| 5 | 1 1 1 1 1<br>0 0 0 1 0 |
| 6 | 1 1 1 0 0<br>0 0 1 0 0 |
| 7 | 1 1 0 0 0<br>0 1 0 0 0 |
| 8 | 1 0 0 0 0<br>1 0 0 0 0 |
| 9 | 0 0 0 0 0<br>1 0 0 0 0 |

SYSTEM FOR COUNTING A NUMBER OF CLOCK CYCLES SUCH THAT A COUNT SIGNAL IS DIVERTED FROM A CASCADED SERIES OF WRITE LATCHES TO A CASCADED SERIES OF ERASE LATCHES

TECHNICAL FIELD

The present invention is generally related to the field of digital circuitry design and, more particularly, is related to a system and method for counting clock cycles in a digital circuit.

BACKGROUND OF THE INVENTION

Many integrated circuits such as processor circuits, etc., employ one or more clocks that generate a steady stream of timing pulses to synchronize operation of the circuit itself. In many cases, a system clock signal of the integrated circuit is generated at a predetermined frequency using a phase locked loop. In general, for example, the clock rate of a computer identifies its overall processing speed and is often set to go as high as other components in the computer will allow.

Some processor circuits and other integrated circuits often include component circuits that require a clock signal that is synchronized with the system clock signal, but stepped down in frequency by a specific ratio in relation to the system clock speed. This ratio may vary from time to time during the operation of the overall circuit.

In order to step down a clock signal to a lower frequency, in some cases a clock counter circuit may be employed. These clock counter circuits may make use, for example, of a circuit resembling a bit shift register that comprises a number of registers or latches in a cascaded series. Each of these latches includes a clock input to receive the clock signal to be stepped down. The output of these latches are applied to a tri-state device. The outputs of the tri-state devices are applied to a common bus that is electrically coupled to a reset input on each of the latches.

A specific number of clock cycles is counted by shifting a logical value across the latches until one of them is reached with a corresponding selected tri-state device. The logical value (such as a logical "1") is then placed on the common bus and resets all of the latches and is provided to state transition circuitry to trigger a change in the state of the stepped down clock. Thus, the system clock may be stepped down by any ratio depending upon the number of latches advancing the logical "1" before the selected tri-state device. However, with very high speed clocks, the above circuit is problematic in that the common bus can provide too great a capacitive load to be driven by a single selected tri-state device within the time frame necessary.

SUMMARY OF THE INVENTION

The present invention provides a system and method for counting a number of clock cycles to step down a clock signal to a lower frequency according to a desired ratio. Briefly described, in architecture, the system comprises a cascaded series of write latches and a cascaded series of erase latches. A cascaded series is defined herein as two or more latches stringed end-to-end with an output from a preceding latch applied as an input of the next adjacent latch. The output of each of the write latches is electrically coupled to a respective diverting multiplexer configured to divert a counting signal from the cascaded series of write latches to the cascaded series of erase latches.

Each diverting multiplexer applies one of either the output of a respective write latch or the output of a preceding adjacent erase latch to an input of a respective erase latch. Each of the diverting multiplexers receives a control input that determines which of its inputs is applies to the respective erase latch. A system clock whose cycles are to be counted on a repeated basis is applied to the clock inputs of the write latches and the erase latches. In order to count a specific number of cycles of the clock, a particular control input of one of the diverting multiplexers is set so as to divert a logical "1" advancing along the write latches into the erase latches. The specific number of clock cycles is counted by forcing a logical "1" to advance through a predetermined number of write and erase latches. Generally, the number of write and erase latches used to count a given number of clock cycles is even. Consequently, the present invention also includes an odd latch to enable the counting of an odd number of clock cycles.

The present system also provides for reset signal pathways by which the write latches are reset by the erase latches as a logical "1" is advanced along the cascaded series of erase latches. The reset signal pathways ensure that the write latches are reset to a logical "0" when the desired number of clock cycles has been counted so that the next group of clock cycles may be counted.

The above system is employed to count a desired number of clock cycles on a repeated basis, where the desired number of clock cycles counted depends upon the resulting clock frequency reduction ratio to be achieved. The present system generates an output each time the desired number of clock cycles is counted. This output may then be employed to change the state of a reduced clock signal accordingly.

The present invention can also be viewed as providing a method for counting a number of clock cycles. In this regard, the method can be broadly summarized by the following steps: counting a first number of the clock cycles by advancing a bit along a cascaded series of write latches, diverting the bit from the cascaded series of write latches into a cascaded series of erase latches, and counting a second number of the clock cycles by advancing the bit along the cascaded series of erase latches. The method further comprises the steps of counting a clock cycle in an odd latch coupled at an end of the cascaded series of erase latches, and, resetting the cascaded series of write latches while advancing the bit along the cascaded series of erase latches.

The system and method of the present invention are programmable to achieve any one of a number of clock frequency reduction ratios, thereby providing a significant advantage. In particular, by manipulating the control inputs to the diverting multiplexers, a desired number of write latches and erase latches may be employed to count the clock cycles on a repeated basis. In this manner, the user may specify a desired clock frequency reduction ratio with relative ease rather than requiring new and unique counting circuitry to accomplish different clock frequency reduction ratios.

Also, each erase latch need only reset a limited number of the write latches. In one embodiment, the number of write latches that is reset by each of the erase latches is two, although a greater or lesser number of write latches may be reset by each erase latch accordingly. This avoids the problem of employing a single common bus to reset all of the write latches and therefore, the clock counter circuit resulting therefrom will provide a reliable count of the clock cycles without the problem of the capacitive loading as experienced by the prior art.

Other features and advantages of the present invention will become apparent to one with skill in the art upon examination of the following drawings and detailed description. It is intended that all such additional features and advantages be included herein within the scope of the present invention.

BRIEF DESCRIPTION OF THE SEVERAL VIEWS OF THE DRAWINGS

The invention can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views.

FIG. 3 is a chart of the states of the write, erase, and odd latches in the clock counter circuit of FIG. 2 in relation to the clock cycles.

DETAILED DESCRIPTION OF THE INVENTION

Figure 1:
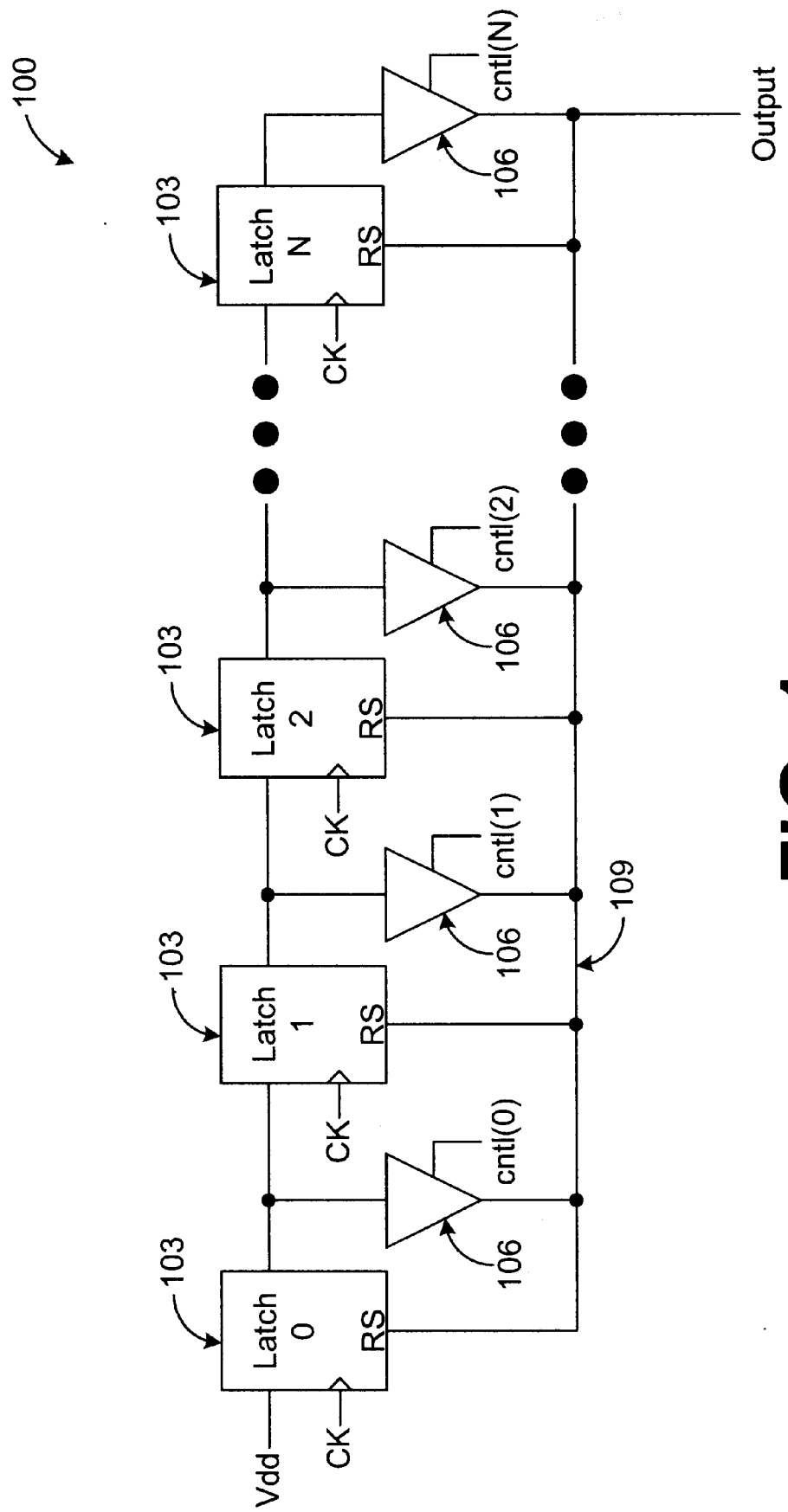
FIG. 1 is a schematic of a clock counter circuit according to the prior art.

With reference to FIG. 1, shown is a clock counter circuit 100 according to the prior art. The clock counter circuit 100 includes a number of latches 103 that together form a bit shift register. The output of each of the latches 103 is applied to the next consecutive latch, thereby forming a cascaded series of latches that forms the bit shift register. The outputs of the latches 103 are also applied to the number of tri-state devices 106 as shown. The respective outputs of the tri-state devices 106 are thereafter applied to a common bus 109 that is in turn applied to the reset inputs of the latches 103. Each tri-state device 106 includes a control input cntl(n). In addition, each latch 103 includes a clock input CK. The number of latches 103 and corresponding tri-state devices 106 employed by the clock counter circuit 100 may vary depending upon the precise clock frequency reduction desired as will be discussed.

Next, the operation of the clock counter circuit 100 is discussed. To begin, an appropriate control input cntl(n) is applied to one of the tri-state devices 106 thereby applying the output of the corresponding latch 103 onto the common bus 109. Note that all other control inputs cntl(n) to the remaining tri-state devices 106 are set to a low state or logical "0" so that the output of only one of the latches 103 is actually applied to the common bus 109.

When the clock CK begins to pulse, the voltage $V_{dd}$ that is equivalent to a logical "1" is acquired by the latch 103 labeled "0". With each successive pulse of the clock CK, the logical value held by the latch 103 labeled "0" is advanced to the next latch 103 and is continually advanced thereafter to successive latches 103 with each cycle of the clock CK. When the logical "1" reaches the particular latch 103 that corresponds to the selected tri-state device 106, the tri-state device 106 applies the same to the common bus 109. Upon the next cycle of the clock, each of the latches 103 is reset as the common bus 109 is applied to each of the reset inputs of the latches 103. In addition, the logical "1" that is output from the selected tri-state device 106 is applied as an output to a circuit that generates the clock of a reduced rate. Specifically, the output is used to trigger a change in the state of the reduced clock thereby generating a clock signal of a reduced frequency, but at the same time synchronized with the original clock CK.

In this manner, the clock counter circuit 100 can step down a clock signal CK by any particular ratio depending on the control input cntl(n) that is activated. Specifically, for example, if a reduction ratio of 3:1 is desired, then the control input cntl(2) is set high so that a logical "1" is advanced through three of the latches 103 before it is applied as an output and resets the corresponding clock counter circuit 100 accordingly.

Unfortunately, clock counter circuit 100 is not without problems. In particular, the common bus 109 presents a significant capacitive load to any one of the selected tri-state devices 106. Specifically, the source and drain components of the transistors that make up the tri-state devices 106 as well as similar circuitry in the reset inputs of the latches 103 add additional capacitive load to what already may be a relatively large common bus 109. This additional capacitive load results in a longer period of time necessary to charge the common bus 109 from one state to another state as known in the art. This longer period of time may be, in fact, longer than a single cycle of the clock CK. Consequently, the common bus 109 may not transition properly within a single cycle of the clock CK in order to generate the corresponding output and reset signals applied to the latches 103. As a result, the clock counter circuit 100 is subject to failure.

Figure 2:
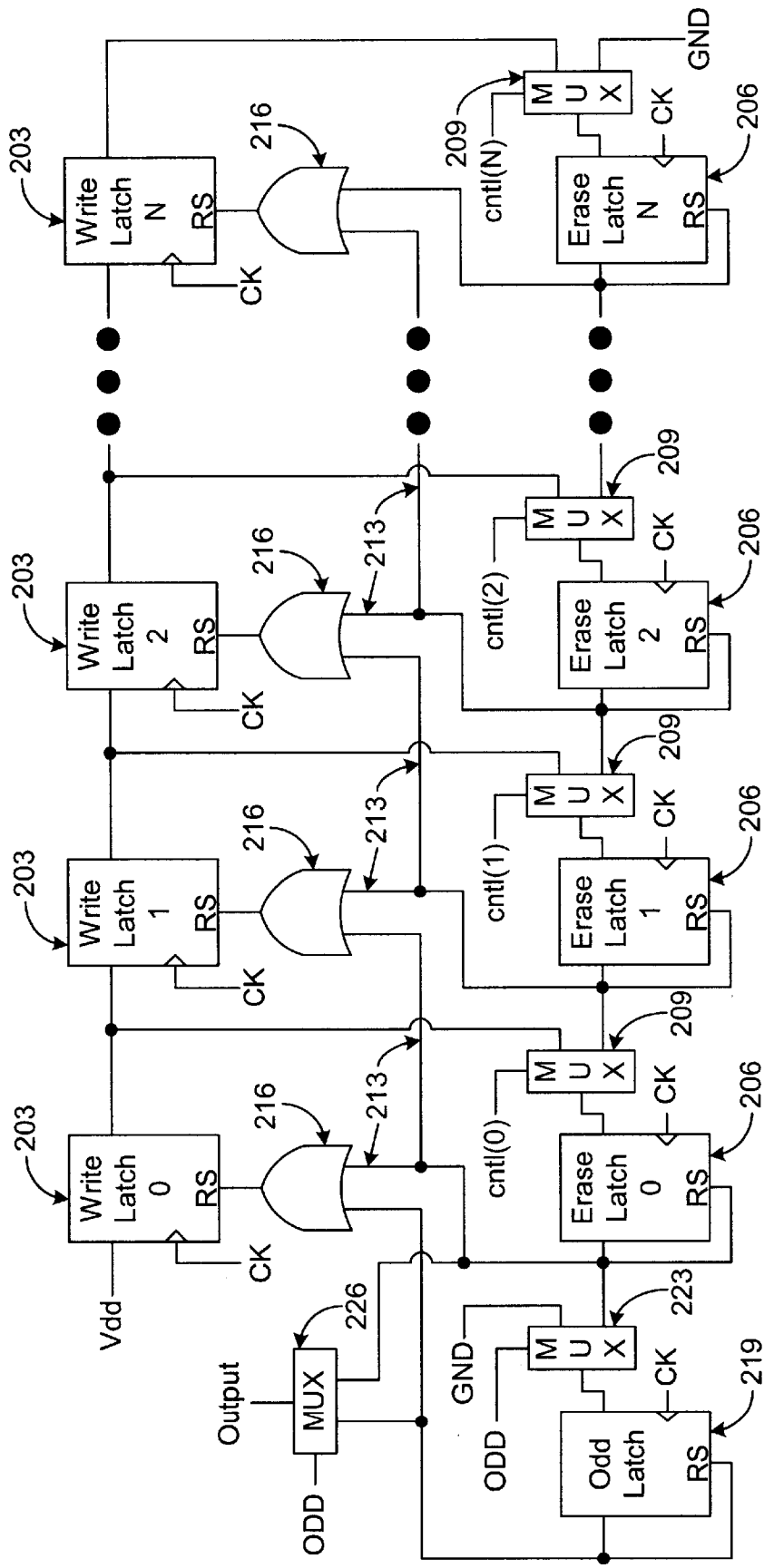
FIG. 2 is a schematic of a clock counter circuit according to an embodiment of the present invention.

With reference then to FIG. 2, shown is a clock counter circuit 200 according to an embodiment of the present invention. The clock counter circuit 200 includes a number of write latches 203 that are electrically coupled together in a cascaded series. Likewise, the clock counter circuit 200 also includes a number of erase latches 206 that are also electrically coupled together in a cascaded series as shown. As defined herein, a cascaded series of latches includes two or more latches stringed end-to-end with an output from a preceding latch applied to an input of the next adjacent latch as shown in FIG. 2. The write latches 203 and the erase latches 206 are aligned in pairs of latches that are numbered accordingly. For example, the leftmost write latch 203 and the leftmost erase latch 206 are numbered "0" accordingly. Likewise, the second pair is numbered "1" and the pairs continue up to the Nth pair as shown.

The clock counter circuit 200 also includes a number of diverting multiplexers 209, each diverting multiplexer 209 being associated with each pair of write and erase latches 203 and 206 as shown. Each of the diverting multiplexers 209 includes two inputs and a single output. One of these inputs receives an output from the corresponding write latch 203. The second of these inputs receives an output from an adjacent erase latch 206 as shown. The output of the diverting multiplexers 209 are applied to the inputs of respective erase latches 206 as shown. Thus, the cascaded series of erase latches 206 is established through the diverting multiplexers 209. The diverting multiplexers 209 toggle between one of two states based upon the control inputs cntl(n) that cause the respective diverting multiplexer 209 to apply either the output of the corresponding write latch 203 into the erase latch 206 or the output of an adjacent erase latch 206 to the input of the corresponding erase latch 206. Essentially, the diverting multiplexers 209 perform a function of diverting an advancing logical "1" across the cascaded series of write latches 203 into the cascaded series of erase latches 206 as will be discussed.

The clock counter circuit 200 also includes a number of reset signal pathways 213 between the cascaded series of erase latches 206 and the cascaded series of write latches 203. The reset signal pathways 213 allow one or more of the write latches 203 to be reset by one or more of the erase latches 206 in accordance with an embodiment of the present invention. The reset signal pathways 213 include a number of "OR" gates 216 as shown that allow more than one erase latch 206 to reset each write latch 203. In addition, the output of each erase latch 206 is also applied to its respective reset input RS.

The clock counter circuit 200 further comprises an odd latch 219 as well as an odd multiplexer 223. The odd multiplexer 223 includes two inputs, one of which receives an output of the erase latch 206 labeled "0" and the other input receiving a ground signal GND that is the equivalent of a logical "0". Depending on the state of the odd multiplexer 223 as determined by the odd signal ODD, either a ground signal GND (logical "0") or the output of the erase latch 206 labeled "0" is applied as an input to the odd latch 219.

The clock counter circuit 200 also includes an output multiplexer 226 that has two inputs. One of the inputs of the output multiplexer 226 receives an output of the erase latch 206 labeled "0" and the other input of the output multiplexer 226 receives the output of the odd latch 219 as shown. The state of the output multiplexer 226 is controlled by the odd signal ODD.

Next, the operation of the clock counter circuit 200 is discussed according to an embodiment of the present invention. To begin, a high voltage $V_{dd}$ representing a logical "1" is continually applied to the input of the leftmost write latch 203 labeled "0". When the clock CK experiences a single cycle, the logical "1" applied to the input of the leftmost write latch 203 is acquired by the leftmost write latch 203. Thereafter, the same logical "1" is advanced along the cascaded series of write latches 203 with each successive clock cycle of the clock CK. This continues until the logical "1" is redirected to one of the erase latches 206 through one of the diverting multiplexers 209 that is activated by applying an appropriate control input cntl(n) thereto.

Then, with each successive clock cycle, the logical "1" is advanced along the cascaded series of erase latches 206 in the reverse direction. Note that the logical "1" continues along the write latches 203 beyond the diverting multiplexer 209. This occurrence is of little consequence as the state of the write latches 203 beyond the activated multiplexer 209 is irrelevant to the operation of the clock counter circuit 200. When the logical "1" reaches the erase latch 206 labeled "0" it is passed as an output if the odd multiplexer 223 is set to receive the ground GND as an input. Otherwise, the logical "1" progresses to the odd latch 219 where it is finally passed as an output after another successive clock cycle. The output is then employed to control a state of a clock signal with a reduced frequency according to a desired frequency reduction ratio.

As the logical "1" advances along the cascaded series of erase latches 206, the write latches 203 that lie before the activated diverting multiplexer 209 are reset via the reset signal pathways 213. Specifically, when the output of each erase latch 206 is set to a logical "1", the same is applied to the reset inputs of the corresponding write latch 203 as well as the previous write latch 203 as shown. Thus, each erase latch 206 will reset two of the write latches 203 when it acquires a logical "1". This ensures that no undesired logical "1" is diverted by the activated diverting multiplexer 209 and that all write latches 203 are reset by the time the logical "1" reaches the $0^{th}$ erase latch 206.

The clock counter circuit 200 provides a distinct advantage in that each erase latch 206 need only reset a limited number of the write latches 203 which in this case is two, although a greater or lesser number of write latches 203 may be reset by each erase latch 206 accordingly. This avoids the problem of employing a single common bus to reset all of the write latches 203 and therefore, the clock counter circuit 200 will provide a reliable count of the clock cycles CK without the problem of the capacitive loading as experienced by the prior art.

In addition, the clock counter circuit 200 also provides another advantage in that it is programmable to count any number of clock cycles to achieve any of a number of frequency reduction ratios. Specifically, the clock counter circuit 200 is programmed by setting one of the control inputs cntl(n), thereby activating a corresponding diverting multiplexer 209 to force a logical "1" to advance through a desired number of write and erase latches 203 and 206. Also, the odd input ODD may be set as desired to include or exclude the odd latch 219 along with the write and erase latches 203 and 206 to count an odd or even number of cycles of the clock CK.

With reference to FIG. 3, shown is a graph 300 that illustrates the state of the write, erase, and odd latches 203, 206, and 219 with respect to a specific progression of cycles of the clock CK for an exemplary configuration of the clock counter circuit 200. The graph 300 provides a specific example of the operation of the clock counter circuit 200 for greater clarity. For the following example, it is assumed that N is greater than or equal to 4 and that the $3^{rd}$ control input cntl(3) is set to a logical "1", thereby diverting the output of the write latch 203 labeled "3" into the erase latch 206 labeled "3". Also, the odd input ODD is set so that the odd multiplexer 223 applies the output of the $0^{th}$ erase latch 206 to the input of the odd latch 219 and the output multiplexer 226 applies the output of the odd latch 219 as the output of the clock counter circuit 200. Before the first clock cycle (clock cycle "0"), the write latches 203, erase latches 206, and odd latch 219 are all set to a logical "0" as shown.

Given that the input of the leftmost write latch 203 labeled "0" is set to a logical "1" ($V_{dd}$), when the first cycle of the clock CK occurs, a logical "1" is acquired by the leftmost write latch 203. With the successive clock cycles 2, 3, and 4, a logical "1" is acquired by write latches 203 labeled 1–3. When the $5^{th}$ clock cycle occurs, a logical "1" is acquired by the $4^{th}$ write latch 203 and the $3^{rd}$ erase latch 206. This is due to the fact that the control input cntl(3) is set so as to divert the logical "1" output from the $3^{rd}$ write latch 203 into the $3^{rd}$ erase latch 206.

During the $6^{th}$ cycle of the clock CK, the logical "1" acquired by the $3^{rd}$ erase latch 206 is transferred to the $2^{nd}$ erase latch 206 and the $3^{rd}$ write latch 203, $4^{th}$ write latch 203, and the $3^{rd}$ erase latch 206 are reset due to the application of a logical "1" to the reset inputs RS of those components. Note that the $5^{th}$ write latch 203 acquires a logical "1", but since this latch is beyond the activated diverting multiplexer 209, it is ignored. Although the $4^{th}$ write latch 203 is reset, note that its state is also of no relevance to the operation of the circuit.

During the $7^{th}$ cycle of the clock CK, the logical "1" held by the $2^{nd}$ erase latch 206 is transferred to the $1^{st}$ erase latch 206. Also, the logical "1" held by the $2^{nd}$ write latch 203 is transferred to the $3^{rd}$ write latch 203 but it disappears because the $2^{nd}$ and $3^{rd}$ write latches 203 are reset from the output of the $2^{nd}$ erase latch 206 via the respective OR gates 216. The same happens upon the occurrence of the $8^{th}$ cycle of the clock CK, where the logical "1" is acquired by the $0^{th}$ erase latch 206.

Finally, during the 9$^{th}$ cycle of the clock CK, the logical "1" held by the 0$^{th}$ erase latch 206 is acquired by the odd latch 219. At this point, the output of the odd latch 219 is a logical "1" that is generated at the output of the output multiplexer 226. A subsequent cycle of the clock CK places the clock counter circuit 200 into the state of the first cycle of the clock in the chart 300. Thus, a logical "1" is seen at the output of the clock counter circuit 200 every ninth cycle of the clock CK, resulting in a clock rate reduction ratio of 9:1. If the odd latch 219 is not used as above, this ratio is 8:1. By setting one of the control inputs cntl(n) and the odd control input ODD appropriately, any ratio reduction rate may be created.

It should be apparent then why the output of each of the erase latches 206 is applied to the reset inputs RS of the corresponding paired write latch 203 and the next adjacent write latch 203. Since the logical "1's" are continually passed along the cascaded series of write latches 203 with each cycle of the clock CK, it is necessary to reset the next adjacent write latch 203 that will acquire a logical "1" if it is not reset along with the write latch 203 that corresponds to the current erase latch 206 that holds a logical "1". This prevents an unwanted logical "1" from being advanced along the write latches 203 and being diverted by the activated diverting multiplexer 209, accordingly.

Many variations and modifications may be made to the above-described embodiment(s) of the invention without departing substantially from the spirit and principles of the invention. All such modifications and variations are intended to be included herein within the scope of the present invention.

What is claimed is:

1. A system for counting a number of clock cycles, comprising:
   a cascaded series of write latches;
   a cascaded series of erase latches;
   at least one diverting multiplexer configured to divert a counting signal from the cascaded series of write latches to the cascaded series of erase latches; and
   at least one reset signal pathway from the cascaded series of erase latches to the cascaded series of write latches to reset the write latches.

2. The system of claim 1, further comprising an odd latch coupled at an end of the cascaded series of erase latches.

3. The system of claim 1, wherein a total number of the write latches is equal to a total number of the erase latches.

4. The system of claim 1, wherein the at least one reset signal pathway further comprises at least one logical circuit to trigger a reset input of at least one of the write latches based upon an output from at least one of the erase latches.

5. The system of claim 4, wherein the at least one logical circuit further comprises a logical OR circuit.

6. A system for counting a number of clock cycles, comprising:
   cascaded write means for tracking a first number of the clock cycles;
   cascaded erase means for tracking a second number of the clock cycles;
   diverting means for diverting a counting signal from the cascaded write means to the cascaded erase means; and
   erase means for resetting the cascaded write means after the counting signal has been diverted to the cascaded erase means.

7. The system of claim 6, further comprising means for adding an odd interval to the cascaded erase means.

8. The system of claim 6, wherein the first and second numbers of clock cycles are equal.

9. A method for counting a number of crock cycles, comprising the steps of:
   counting a first number of the clock cycles by advancing a bit along a cascaded series of write latches;
   diverting the bit from the cascaded series of write latches into a cascaded series of erase latches;
   counting a second number of the clock cycles by advancing the bit along the cascaded series of erase latches; and
   resetting the cascaded series of write latches while advancing the bit along the cascaded series of erase latches.

10. The method of claim 9, further comprising the step of counting an odd latch coupled at an end of the cascaded series of erase latches.

11. The method of claim 9 wherein the step of resetting the cascaded series of write latches further comprises applying at least one output signal from at least one respective erase latch via at least one reset pathway to at least one reset input of at least one respective write latch.

12. The system of claim 1, further comprising a number of reset signal pathways, each of the reset signal pathways applying an output of one of the erase latches to a reset input of at least one of the write latches.

13. The system of claim 1, further comprising a number of reset signal pathways, each of the reset signal pathways applying an output of one of the erase latches to a reset input of two of the write latches.

14. The system of claim 1, further comprising a number of reset signal pathways, each of the reset signal pathways applying an output of one of the erase latches to a reset input of the one of the erase latches.

15. The system of claim 1, further comprising a number of reset signal pathways, each of the reset signal pathways applying an output of one of the erase latches to a reset input of a limited number of the write latches, wherein each of the reset signal pathways presents a capacitive load that allows a transition from a first state to a second state within a single cycle of a clock applied to each of the write latches and to each of the erase latches.

16. The system of claim 6, wherein:
   the cascaded write means further comprises a number of cascaded write latches;
   the cascaded erase means further comprises a number of cascaded erase latches; and
   the erase means further comprises a number of reset signal pathways, each of the reset signal pathways applying an output of one of the erase latches to a reset input of at least one of the write latches.

17. The system of claim 16, wherein each of the reset signal pathways applies the output of one of the erase latches to the reset input of two of the write latches.

18. The system of claim 16, wherein each of the reset signal pathways applies the output of one of the erase latches to a reset input of the one of the erase latches.

19. The system of claim 16, wherein each of the reset signal pathways applies the output of one of the erase latches to the reset input of a limited number of the write latches, wherein each of the reset signal pathways presents a capacitive load that allows a transition from a first state to a second state within a single cycle of a clock applied to each of the write latches and to each of the erase latches.

20. The method of claim 9, wherein the step of resetting the cascaded series of write latches further comprises the step of applying an output of each of the erase latches to at least one of the write latches.

21. The method of claim 9, wherein the step of resetting the cascaded series of write latches further comprises the step of applying an output of each of the erase latches to the reset input of two of the write latches.

22. The method of claim 9, further comprising the step of resetting the cascaded series of erase latches while advancing the bit along the cascaded series of erase latches.

23. The method of claim 9, wherein the step of resetting the cascaded series of write latches further comprises the step of applying an output of one of the erase latches to a reset input of a limited number of the write latches, wherein each of the reset signal pathways presents a capacitive load that allows a transition from a first state to a second state within a single cycle of a clock applied to each of the write latches and to each of the erase latches.

* * * * *

UNITED STATES PATENT AND TRADEMARK OFFICE
CERTIFICATE OF CORRECTION

PATENT NO. : 6,591,371 B1
DATED : July 8, 2003
INVENTOR(S) : Gerard M. Blair

It is certified that error appears in the above-identified patent and that said Letters Patent is hereby corrected as shown below:

Column 7,
Line 66, delete "crock" and insert therefor -- clock --

Signed and Sealed this

Twenty-ninth Day of March, 2005

JON W. DUDAS
*Director of the United States Patent and Trademark Office*